United States Patent [19]

Erhage

[11] Patent Number: 5,596,323
[45] Date of Patent: Jan. 21, 1997

[54] METHOD AND ARRANGEMENT FOR ANALOGUE-DIGITAL CONVERTERS

[75] Inventor: Lars Erhage, Göteborg, Sweden

[73] Assignee: Telefonaktiebolaget LM Ericsson, Stockholm, Sweden

[21] Appl. No.: 434,536

[22] Filed: May 4, 1995

[30] Foreign Application Priority Data

May 4, 1994 [SE] Sweden .................. 9401537

[51] Int. Cl.⁶ .............. H03M 1/12; H04L 27/38
[52] U.S. Cl. .............. 341/155; 341/111; 341/116; 375/324
[58] Field of Search .............. 341/111, 155, 341/116, 112; 375/324, 327, 280, 281, 284, 329, 332, 180; 329/50, 304, 336

[56] References Cited

U.S. PATENT DOCUMENTS

| | | | |
|---|---|---|---|
| 4,334,312 | 6/1982 | Yoshida | 375/20 |
| 4,348,641 | 9/1982 | Scott et al. | 329/50 |
| 4,875,049 | 10/1989 | Yoshida | |
| 5,134,634 | 7/1992 | Yoshida | 375/80 |
| 5,150,384 | 9/1992 | Cahill | 375/97 |
| 5,157,344 | 10/1992 | Ichihara | 329/336 |
| 5,172,070 | 12/1992 | Hiraiwa et al. | 329/304 |
| 5,216,425 | 6/1993 | Erhage | |
| 5,438,591 | 8/1995 | Oie et al. | 375/261 |

FOREIGN PATENT DOCUMENTS 500507   8/1992   European Pat. Off. .

*Primary Examiner*—Jeffrey A. Gaffin
*Assistant Examiner*—Peguy JeanPierre
*Attorney, Agent, or Firm*—Burns, Doane, Swecker & Mathis, L.L.P.

[57] ABSTRACT

A method and an arrangement for reducing the influence from distortion which is produced when an electrical signal, which is divided into two components, is converted from analogue to digital form. The signal is divided in a phase detector in which it is phase detected with respect to two reference signals, phase shifted 90° with respect to each other. The two components are frequency coded by the reference signals which are provided with a periodic frequency sweep. After the conversion into digital form, each of the components are frequency decoded so that they, with respect to frequency, appear as narrow band signals while possible harmonics which are part of the distortion, are distributed over a frequency range defined by the size of the periodic frequency sweep.

10 Claims, 1 Drawing Sheet

METHOD AND ARRANGEMENT FOR ANALOGUE-DIGITAL CONVERTERS

BACKGROUND

The present invention relates to a method and an arrangement for reducing the influence of distortion in connection with analogue-digital conversion.

In modern electronic systems for information transmission, the information is often transferred on frequencies different to the original. During signal processing of the transmitted signal, the signal is thus returned to the original frequency. The transmitted signal can, for example, be a carrier wave which is modulated with the information signal.

In connection with signal processing, it is often desirable to detect both the amplitude and phase of the information signal. In such cases, quadrature detection is employed, whereby the signal is mixed down (converted) to the base band in two parallel mixers with 90° phase difference, i.e. to the original frequency of the information signal. Accordingly, during detection two 90° phase-shifted signals, normally termed I (In phase) and Q (Quadrature), are obtained. The signals are converted to digital form in an A/D-converter for each signal and thereafter stored together, whereby both amplitude and phase information is attained.

So that both the amplitude and the phase information is correct, the processing of the I-signal and the Q-signal must occur in identical channels.

However, during the A/D-conversion, distortion/interference arises i.e. in the form of harmonics of the input signal, primarily due to the fact that the conversion is not linear. A mirror (image) tone of the input signal arises even though differences are present in, for example, amplification between the two A/D-converters.

Normally, the mixing down (conversion) to the base band takes place using a local oscillator signal with a constant frequency. The distortion which arises can thus affect the working (utility) signal which coincides with the frequencies of the distortion which arises.

An earlier known arrangement for reducing the influence of distortion is described in Swedish patent application SE9100501-7 which corresponds to U.S. Pat. No. 5,216,425. According to this document, I and Q are phase-modulated before the A/D-conversion and demodulated after the conversion. The phase modulation is altered randomly between each sample which is to be converted. By using this method, the energy content of the distortion products will be spread out over a relatively wide band and it will thus be possible to filter out the information carrying signal, the working signal, with a narrow band filter. Since the energy content of the distortion products is spread out over a wide band, the noise level will be raised. If the distortion products are large, an unacceptably high noise level will thus arise. The flexibility of the arrangement to be used for different forms of distortion/disturbance is thus limited.

SUMMARY

One object of the invention is thus to provide a method and an arrangement which reduce the influence of harmonics which are created in connection with A/D-conversion of quadrature detected signals, but which can also effectively be used to reduce the influence of, for example, mirror (image) tones.

A further object of the invention is to reduce the influence of other disturbances, the frequencies of which are known.

These objects are achieved according to the invention by adding a frequency sweep to the local oscillator signal during quadrature detection. In this manner, the working signal and distortion/harmonics will obtain different frequency sweeps. Mirror (image) tones obtain a sweep opposite to that of the working signals and harmonics obtain a sweep having a frequency increase equal to the input signal multiplied by the harmonic order.

In order to restore the working signal after the A/D-conversion, the signal is multiplied by a digital sweep opposite to the sweep on the local oscillator signal. Distortion will thus also be frequency-decoded but will obtain a remaining frequency sweep. This is a result of the distortion being "provided" with frequency sweeps different from the frequency sweep of the input signal. Accordingly, the distortion (the harmonics) will be distributed over a wider frequency band within which the working signals appear as narrow band signals, which allows the possibility to filter out the working signals which were previously "covered" by distortion.

DETAILED DESCRIPTION

Figure 1:
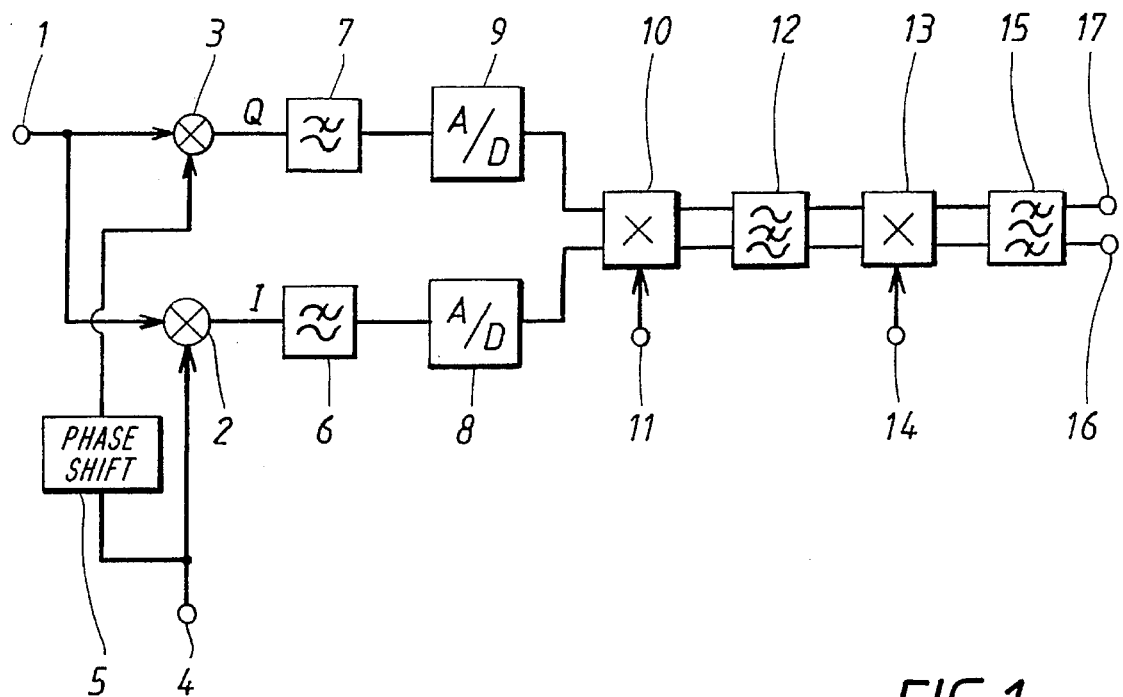
FIG. 1 shows a block diagram of an embodiment of an arrangement according to the invention.

The method which constitutes a part of the invention will be described in greater detail in the following. The method means that in connection with quadrature detection of an information-carrying signal, the produced I- and Q-signals are frequency-coded with a frequency sweep, for example by providing a periodically repeated frequency sweep to the local oscillator signals which constitute reference signals for the two mixers of the detector by frequency modulation.

The period of the frequency sweep is adapted to the signal band width of the information-carrying signal. Thus, the frequency sweep should not be repeated quicker than the time required for receival of the smallest information bit, i.e. the period time should be longer than 1 divided by the signal band width.

The region in which the frequency is swept should be as large as possible in order to distribute the energy content of the distortion products over a large frequency range. In practice, the sweep range is however restricted by the band width of the subsequent A/D-converter since a sweep outside of the band width will be filtered away.

After the "working signals" I and Q have been A/D-converted, frequency decoding takes place by multiplying the signals digitally with a frequency sweep opposite to that which is applied to the local oscillator signal. The I and Q-signals will thus, in terms of frequency, be returned to one frequency, whilst the distortion products will have a remaining frequency variation. In this manner, with the aid of narrow band filters, it will be possible to filter out the I- and Q-signals at the same time that the distortion products are filtered away.

The theory behind the described method is the following: When the I- and Q-signals are frequency coded, they will be "provided" with a frequency sweep-dependent component. The frequency sweep has a certain "gradient" frequency change per unit time) and "direction" (frequency increase or decrease). Distortion products which, in the form of harmonics, arise in connection with the A/D-conversion will thus also comprise a frequency sweep dependent component, but since the frequency of the harmonics is multiples of the base frequency, the frequency sweep-dependent component of the harmonics will be a multiple of the frequency sweep. A second tone will thus contain a frequency sweep-dependent component whose gradient is twice that of the original sweep.

During frequency decoding, the signals are multiplied by a sweep with a direction which is opposite to that of the original frequency sweep. By means of this frequency decoding, signal decoding, the basic tone which corresponds to the I- and Q-signals will be returned to its base frequency. On the other hand, for example a second tone will have a frequency sweep-dependent component remaining since its frequency sweep-dependent component before the decoding was twice that of the original sweep. In a corresponding manner, a third tone will have a frequency sweep-dependent component remaining whose gradient is twice that of the original sweep.

The consequence of this is that the I- and Q-signals, after the frequency decoding, will, in terms of frequency, appear as narrow band signals, whilst the harmonics will be distributed over a frequency range which is determined by the size of the frequency sweep and thus obtain a noisebased character. With the help of a band pass filter (or a low pass filter) dependent on the frequency of the I- and Q-signals, these can thus be filtered out at the same time that the distortion products are blocked.

The method can also be described in the following manner:

If the input signal is set to $=e^{j\omega t}$ and the frequency sweep $=e^{j\mu t^2}$ the signal which is A/D-converted can be denoted as $e^{j\omega t} \cdot e^{j\mu t^2} = e^{j(\omega t + \mu t^2)}$. After the A/D-conversion, the signal which consists of the working signal and distortion can be written as, $$\sum_{-\infty}^{\infty} a_n e^{jn(\omega t + \mu t^2)},$$

where n=1 corresponds to the working signal and n=−1 corresponds to the mirror (image) tone.

After the decoding, i.e. after multiplication with $e^{-j\mu t^2}$ the following is obtained $$a_1 e^{j\omega t} + \sum_{n=2}^{\infty} a_n e^{j(n\cdot\omega t + (n-1)\mu t^2)} + \sum_{-\infty}^{\infty} a_n e^{j(n\cdot\omega t + (n-1)\mu t^2)},$$

where the first term is the working signal and the rest is distortion. The distortion is thus a remaining frequency sweep.

Under certain circumstances, for example if the mirror tone content in the distortion products is high, the noise level caused by the distortion products will be troublesomely high. This problem can however be reduced by filtering away the mirror (image) tones before the signal decoding.

Due to its flexibility, the described method is easy to adapt so that it can also be used to filter away mirror tones. Since a mirror tone arises from signals whose signals with respect to the frequency of the local oscillator signal are opposite to that of the intended "working" input signal, during frequency coding the mirror tone will obtain a frequency sweep whose gradient is opposite that of the input signal and the harmonics.

If a further decoding, the mirror decoding is thus carried out before the above described signal decoding, mirror tones can be filtered away. In this decoding, the I- and Q- signals are multiplied after the A/D-conversion by a frequency sweep with the same gradient as that which is added to the local oscillator signal, i.e. a frequency sweep with opposite gradient compared to that of the mirror tone. This implies that after the decoding, the mirror tone will be, with regard to frequency, a narrow band signal whilst remaining signals, harmonics and the "working" base tone are distributed over the frequency range. Using a suppression filter, the mirror tone can thus be filtered away. Of course, a portion of the working signal will also be suppressed in the suppression filter, but since the working signal is distributed over a large frequency range (in the order of magnitude twice the frequency sweep), the effect of the filter on the working signal will only consist of a small amplitude loss.

The mirror decoding can also be described in the following manner: After A/D-conversion a mirror of the working signal is obtained. This can be expressed as $a_{-1} \cdot e^{-j(\omega t + \mu t^2)}$. After mirror decoding (multiplication by $e^{j\mu t^2}$) is obtained, $$a_{-1} \cdot e^{-j\omega t}$$

i.e. the mirror tone appears as a narrow band signal and can be filtered away with the blocking filter.

After the mirror decoding, the working signals (I and Q respectively) will of course be decoded. Since, by the mirror decoding, these are provided with an extra frequency sweep, the signal decoding occurs by multiplication with a frequency sweep having double and opposite gradient compared to the original frequency sweep applied to the local oscillator. The result from this signal decoding is the same as for that described earlier.

In an analogous manner, the method can be employed to effectively filter away disturbances whose frequencies are known (and are narrow band).

An example of an arrangement where the above presented method is applied will be described in the following with reference to FIG. 1.

In FIG. 1, reference numeral 1 denotes a first input connection to which a signal which is to be quadrature-detected is applied. The input signal can thus be a carrier frequency signal on which an information-carrying signal is modulated. The input connection is connected to two phase detectors 2 and 3. A local oscillator signal is connected to a second input connection 4. The local oscillator signal is fed from there directly to one of the phase detectors 2 and via a phase shifter 5 to the other phase detector 3. The local oscillator signal is phase-shifted by 90° in the phase shifter 5.

The output signal from the phase detector 2 is the earlier mentioned I-signal, whilst the output signal from the phase detector 3 is the Q-signal. The I- and Q-signals proceed via filters 6, 7 respectively to A/D-converters 8, 9 respectively. After the A/D-conversion, the I- and Q-signals proceed in digital form to a first multiplier unit 10 where each is multiplied by a signal which is fed to the multiplier unit via the connection 11. The output signals from the multipliers pass through a suppression filter 12 to a second multiplier unit 13 where they are multiplied by a signal supplied on the multiplier connection 14. The signals resulting from the second multiplier proceed via a filter (band pass or low pass filter) to the output connections 16 (the filtered I-signal) and 17 (the filtered Q-signal).

Figure 2:
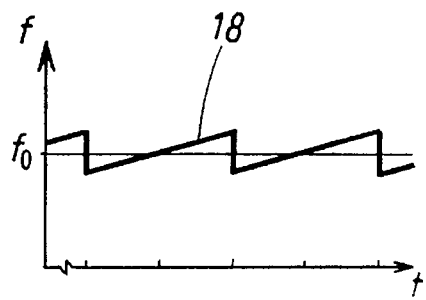
FIG. 2 shows the relation between the frequency of the local oscillator and time.

In the subsequent (not shown) signal processing stage, the two filtered I- and Q-signals can be brought together, whereby the amplitude and phase of the information-carrying signal can be obtained. Since this can be achieved in many ways well known to the skilled person and, in addition, is described in greater detail. not considered a part of the invention, this will not be The thus described arrangement can be used to reduce both the influence of harmonics and mirror (image) tones in accordance with the above-described method. The function of the arrangement is accordingly the following:

A local oscillator signal 18 is applied to the local oscillator connection 4. The correlation between the frequency of the local oscillator and time is shown in FIG. 2. In the drawing, the X-axis represents time (t) and the Y-axis the frequency (f) of the signal. As is also apparent from FIG. 2, the frequency of the oscillator is swept in a sawtooth manner about a mean value $f_0$. $f_0$ can in this connection be regarded as being equal to the earlier-mentioned carrier frequency. The carrier frequency input signal is phase-detected against the local oscillator signal 18 in the phase detectors 2 and 3. The I- and Q-signals resulting from phase detection are supplied, after filtering and A/D-conversion to the multiplier unit 10. A frequency-decoding signal with the same principal appearance as the local oscillator signal 18, though with a different mean value $f_1$, is applied to the multiplier unit 5 via the connection 11. In the case where $f_0$ is equal to the carrier frequency, $f_1$ will be equal to 0. As was apparent from the earlier presentation, the multiplication of this signal and the A/D-converted I- and Q-signals results in the mirror tone, with regard to frequency, appearing as a narrow band signal which can be suppressed in the subsequent suppression filter 12, whilst remaining signals are distributed over the frequency range.

Figure 3:
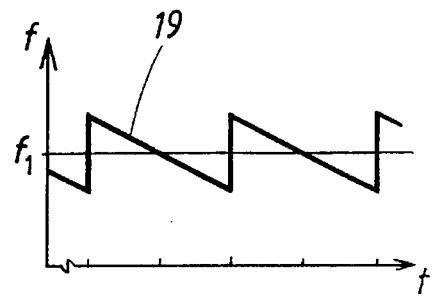
FIG. 3 shows the relation between frequency of the frequency decoding signal and time.

In a corresponding manner, a multiplication is carried out in the multiplier unit 13 between the filtered output signals from the multiplier unit 10 and a frequency decoding signal 19 which is connected to the multiplier connection 14. FIG. 3 shows in a diagram corresponding to that of FIG. 2 the correlation between the frequency and time of the frequency decoding signal 19. In this case, the frequency decoding signal 19 has a gradient which is twice as steep as, but opposite in direction to, the frequency coding signal 18. The result of this multiplication is, as above, that the I- and Q-signals on the output of the multiplier unit appear as, with regard to frequency, narrow band signals, whilst harmonics are distributed in frequency in the form of noise. The noise level is however reduced by filtering away the mirror tone earlier in the signal processing chain.

In the thus described embodiment of the invention, both mirror tones and harmonics have been filtered away. If mirror tones do not constitute a problem, the mirror decoding can of course be omitted. This implies that both the multiplier unit 10 with the connection 11 and the suppression filter 12 can be omitted. The A/D-converted I- and Q-signals are thus directly fed to the multiplier unit 13 where the signal decoding takes place. It is to be noted that in this case the gradient of the frequency decoding signal 19 should be the same as that of the local oscillator signal.

The invention is not restricted to the above described embodiments but can be varied within the scope of the appended claims.

What is claimed is:

1. A method for reducing the influence of distortion which is produced when an electrical signal, which is divided into two components by phase detection against two reference signals phase shifted with respect to each other by 90°, is converted from analogue to digital form, said method comprising:

frequency-coding of the two components by providing the reference signals with a periodic frequency sweep, frequency-decoding each of the two components individually after the conversion to digital form so that they appear as, with regard to frequency, narrow band signals, whilst possible harmonics which are part of the distortion are distributed over a frequency range defined by the size of the periodic frequency sweep.

2. The method of claim 1, wherein the frequency decoding takes place by the two components, after the conversion to digital form, being multiplied by a frequency sweep, the frequency change per unit time of which is the same as for the periodic frequency sweep which the reference signals are provided with, though the direction of which is opposite to that of the periodic frequency sweep.

3. The method of claim 1, wherein before the two components are frequency-decoded, a frequency decoding with respect to mirror (image) tones is carried out by multiplying the components which have been converted to digital form by a frequency sweep which corresponds to the periodic frequency sweep which the reference signals are provided with, whereby the mirror tones are obtained which, with respect to frequency, are narrow band signals which are suppressed, whilst the components and the harmonics in the distortion are distributed over the frequency range which is defined by the size of the periodic frequency sweep.

4. The method of claim 3, wherein the frequency decoding of the two components occurs by the signals which are obtained after the frequency decoding with respect to mirror tones and the suppression of the narrow band signals, being multiplied by the frequency sweep, the frequency change per unit time of which is twice as large as that of the periodic frequency sweep which the reference signals are provided with, and the direction of which is opposite to that of the periodic frequency sweep.

5. The method of claim 1, wherein after the frequency decoding of the two components, these are separated by narrow band filtration.

6. An arrangement for reducing the influence of distortion which is produced when an electrical signal, which is divided into two components by phase detection against two reference signals phase-shifted by 90° with respect to each other in two phase detectors, is converted in analogue/digital converters from analogue to digital form, where said arrangement comprises:

means for frequency-coding the two components by providing the reference signals with a periodic frequency sweep a multiplier arrangement for frequency-decoding each of the two components, after the conversion to digital form, by being multiplied in the multiplier arrangement with a signal dependent on the periodic frequency sweep so that the components are obtained which, with respect to frequency, are narrow band signals, whilst possible harmonics of the two components which are parts of the distortion are distributed over a frequency range defined by the size of the periodic frequency sweep.

7. The arrangement of claim 6, wherein the frequency decoding occurs by the signal dependent on the periodic frequency sweep with which the multiplication in the multiplying arrangement occurs having a frequency change per unit time which is the same as for the periodic frequency sweep which is added to the reference signals but whose direction is opposite to that of the periodic frequency sweep.

8. The arrangement of claim 6, wherein before the two components are frequency-decoded, a frequency decoding with respect to mirror (image) tones is performed by the components which have been converted to digital form in the analogue-digital converters each being multiplied in a multiplier unit by a signal which corresponds to the periodic frequency sweep with which the reference signals are provided, whereby the mirror tones are obtained which, with respect to frequency, are narrow band signals which are suppressed in a suppression filter, whilst the components and the harmonics in the distortion are distributed over the frequency range which is defined by the size of the periodic frequency sweep.

9. The arrangement of claim 8, wherein the frequency decoding of the two components occurs by the signal, which is dependent on the periodic frequency sweep with which the signals which are obtained after the suppression of the narrow band signals in the filter are multiplied in the multiplying arrangement, having a frequency change per unit time which is twice as large as that of the periodic frequency sweep which the reference signals are provided with, and the direction of which is opposite to that of the periodic frequency sweep.

10. The arrangement of claim 6, wherein after the frequency decoding of the two components by the multiplication in the multiplication arrangement, the obtained signals which, with respect to frequency, are narrow band signals are separated by a narrow band filter.

* * * * *